(12) United States Patent
Koya et al.

(10) Patent No.: US 11,196,394 B2
(45) Date of Patent: Dec. 7, 2021

(54) POWER AMPLIFIER MODULE

(71) Applicant: Murata Manufacturing Co., Ltd., Kyoto (JP)

(72) Inventors: Shigeki Koya, Kyoto (JP); Yasunari Umemoto, Kyoto (JP); Yuichi Saito, Kyoto (JP); Isao Obu, Kyoto (JP); Takayuki Tsutsui, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 313 days.

(21) Appl. No.: 16/527,578

(22) Filed: Jul. 31, 2019

(65) Prior Publication Data

US 2020/0052663 A1 Feb. 13, 2020

(30) Foreign Application Priority Data

Aug. 10, 2018 (JP) .............................. JP2018-152115
Apr. 22, 2019 (JP) .............................. JP2019-081295

(51) Int. Cl.
*H03F 3/21* (2006.01)
*H03F 3/45* (2006.01)
(Continued)

(52) U.S. Cl.
CPC ......... *H03F 3/211* (2013.01); *H01F 17/0013* (2013.01); *H01L 23/49822* (2013.01);
(Continued)

(58) Field of Classification Search
CPC ........ H03F 3/211; H03F 3/213; H03F 1/0205; H03F 2200/534; H03F 2200/451;
(Continued)

(56) References Cited

U.S. PATENT DOCUMENTS 7,348,842 B2 * 3/2008 Ichitsubo ................ H01L 23/66
257/E25.03
10,411,660 B1 * 9/2019 Ortiz ....................... H03F 3/195
(Continued)

FOREIGN PATENT DOCUMENTS

JP 2002-043866 A 2/2002
JP 2011-530177 A 12/2011
(Continued)

OTHER PUBLICATIONS

Korean Office action for 10-2019-0095345 dated Jan. 11, 2021.

*Primary Examiner* — Hieu P Nguyen
(74) *Attorney, Agent, or Firm* — Pearne & Gordon LLP

(57) ABSTRACT

A power amplifier module includes a first substrate and a second substrate, at least part of the second substrate being disposed in a region overlapping the first substrate. The second substrate includes a first amplifier circuit and a second amplifier circuit. The first substrate includes a first transformer including a primary winding having a first end and a second end and a secondary winding having a first end and a second end; a second transformer including a primary winding having a first end and a second end and a secondary winding having a first end and a second end; and multiple first conductors disposed in a row between the first transformer and the second transformer, each of the multiple first conductors extending from the wiring layer on a first main surface to the wiring layer on a second main surface of the substrate.

20 Claims, 11 Drawing Sheets

(51) Int. Cl.
*H03F 1/02* (2006.01)
*H01L 23/00* (2006.01)
*H01F 17/00* (2006.01)
*H01L 23/552* (2006.01)
*H03F 3/213* (2006.01)
*H01L 23/66* (2006.01)
*H01L 23/498* (2006.01)

(52) U.S. Cl.
CPC ............ *H01L 23/552* (2013.01); *H01L 23/66* (2013.01); *H01L 24/16* (2013.01); *H03F 1/0205* (2013.01); *H03F 3/213* (2013.01); *H01F 2017/008* (2013.01); *H01L 24/13* (2013.01); *H01L 2223/6644* (2013.01); *H01L 2224/13025* (2013.01); *H01L 2224/16225* (2013.01); *H01L 2924/3025* (2013.01); *H03F 2200/114* (2013.01); *H03F 2200/273* (2013.01); *H03F 2200/451* (2013.01); *H03F 2200/534* (2013.01); *H03F 2200/541* (2013.01); *H03F 2203/21106* (2013.01); *H03F 2203/21142* (2013.01)

(58) Field of Classification Search
CPC . H03F 2203/21106; H03F 2203/21142; H03F 3/19; H03F 3/26; H03F 3/245; H03F 2200/114; H03F 2200/273; H03F 2200/541; H01F 2017/008; H01F 27/29; H01F 2027/2809; H01F 27/2804; H01F 17/0013; H01L 24/16; H01L 23/552; H01L 23/66; H01L 23/49822; H01L 2924/3025; H01L 2224/16235; H01L 2224/0401; H01L 2924/15313; H01L 2924/14; H01L 2924/13051; H01L 2924/1306; H01L 2224/16227; H01L 23/49844; H01L 2224/13025; H01L 2224/16225; H01L 24/13; H01L 2223/6644
USPC .......................................... 330/252–261, 307
See application file for complete search history.

(56) References Cited

U.S. PATENT DOCUMENTS

| | | |
|---|---|---|
| 2009/0309662 A1 | 12/2009 | Yang et al. |
| 2010/0026368 A1 | 2/2010 | Tang et al. |
| 2011/0084765 A1 | 4/2011 | Kim et al. |
| 2012/0075216 A1 | 3/2012 | Black et al. |
| 2014/0097907 A1* | 4/2014 | Yoon ................... H01L 23/5227 330/307 |
| 2017/0222609 A1 | 8/2017 | Lee et al. |

FOREIGN PATENT DOCUMENTS

| | | |
|---|---|---|
| JP | 2012-070151 A | 4/2012 |
| JP | 2013-507774 A | 3/2013 |
| JP | 2013-538010 A | 10/2013 |
| JP | 2017-135356 A | 8/2017 |
| KR | 10-2009-0129379 A | 12/2009 |

* cited by examiner

POWER AMPLIFIER MODULE

This application claims priority from Japanese Patent Application No. 2018-152115 filed on Aug. 10, 2018 and Japanese Patent Application No. 2019-081295 filed on Apr. 22, 2019. The contents of these applications are incorporated herein by reference in their entireties.

BACKGROUND OF THE DISCLOSURE

1. Field of the Disclosure

The present disclosure relates to a power amplifier module.

2. Description of the Related Art

Power amplifiers mounted on wireless communication terminal devices amplify the power of single-ended signals (unbalanced signals) and output the single-ended signals. An example of the configuration of such a power amplifier is as follows: a single-ended signal is converted into a pair of differential signals (balanced signals) by a first transformer, the differential signals are amplified by two respective transistors, and the amplified differential signals are converted into single-ended signals by a second transformer. In this configuration, because the emitter inductance of the transistors for the differential signals is zero, the gain of the power amplifier can be easily increased.

As a related art, Japanese Unexamined Patent Application Publication (Translation of PCT Application) No. 2011-530177 describes an example of the arrangement of a transformer. Japanese Unexamined Patent Application Publication (Translation of PCT Application) No. 2011-530177 describes a technique in which a transformer disposed in a stage preceding a driver amplifier is arranged in a non-semiconductor substrate.

If the first transformer and the second transformer are electromagnetically coupled to provide a feedback path in the configuration of the power amplifier described above, the power amplifier stability (K-factor) is decreased, and the power amplifier may oscillate.

BRIEF SUMMARY OF THE DISCLOSURE

The present disclosure has been made in view of the above circumstances. It is an object of the present disclosure to suppress the decrease in the stability (K-factor) of a power amplifier by suppressing the coupling of a first transformer and a second transformer.

According to preferred embodiments of the present disclosure, a power amplifier module includes a first substrate including a first main surface, a second main surface, and multiple wiring layers, and a second substrate including a first main surface facing the first main surface of the first substrate, at least part of the second substrate being disposed in a region superimposed on the first substrate when viewed in a direction perpendicular to the first main surface of the first substrate. The second substrate includes a first amplifier circuit and a second amplifier circuit each configured to amplify power. The first substrate includes a first transformer disposed at one or more wiring layers among the multiple wiring layers, the first transformer including a primary winding having a first end to which a signal is input and a second end electrically coupled to a first reference potential and a secondary winding having a first end electrically coupled to an input terminal of the first amplifier circuit and a second end electrically coupled to an input terminal of the second amplifier circuit; a second transformer disposed at a position that does not overlap the first transformer and at one or more wiring layers among the multiple wiring layers when viewed in the direction perpendicular to the first main surface, the second transformer including a primary winding having a first end electrically coupled to an output terminal of the first amplifier circuit and a second end electrically coupled to an output terminal of the second amplifier circuit and a secondary winding having a first end from which a signal is output and a second end electrically coupled to a second reference potential; and multiple first conductors disposed in a row between the first transformer and the second transformer when viewed in the direction perpendicular to the first main surface, each of the multiple first conductors extending from the wiring layer on the first main surface to the wiring layer on the second main surface of the first substrate.

According to preferred embodiments of the present disclosure, a power amplifier module includes a first substrate including a first main surface, a second main surface, and multiple wiring layers and a second substrate including a first main surface facing the first main surface of the first substrate, at least part of the second substrate being disposed in a region superimposed on the first substrate when viewed in a direction perpendicular to the first main surface of the first substrate. The second substrate includes a first amplifier circuit and a second amplifier circuit each configured to amplify power. The first substrate includes a first transformer disposed at one or more wiring layers among the multiple wiring layers, the first transformer including a primary winding having a first end to which a signal is input and a second end electrically coupled to a first reference potential and a secondary winding having a first end electrically coupled to an input terminal of the first amplifier circuit and a second end electrically coupled to an input terminal of the second amplifier circuit; a second transformer disposed at a position that does not overlap the first transformer and at one or more wiring layers among the multiple wiring layers when viewed in the direction perpendicular to the first main surface, the second transformer including a primary winding having a first end electrically coupled to an output terminal of the first amplifier circuit and a second end electrically coupled to an output terminal of the second amplifier circuit and a secondary winding having a first end from which a signal is output and a second end electrically coupled to a second reference potential; and a first conductor that is a single component having a substantially wall shape, the first conductor being disposed between the first transformer and the second transformer and extending from the wiring layer on the first main surface to the wiring layer on the second main surface of the first substrate.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Power amplifier modules according to embodiments of the present disclosure will be described in detail below with reference to the attached drawings. The present disclosure is not limited to these embodiments. The embodiments are illustrative, and it goes without saying that structures indicated in different embodiments can be partially replaced or combined. In a second embodiment and subsequent embodiments, the descriptions of the matters common to the first embodiment will be omitted, and only the differences will be described. Particularly, the same operation and effect provided by the same configurations will not be mentioned specifically in each embodiment.

First Embodiment

Figure 1:
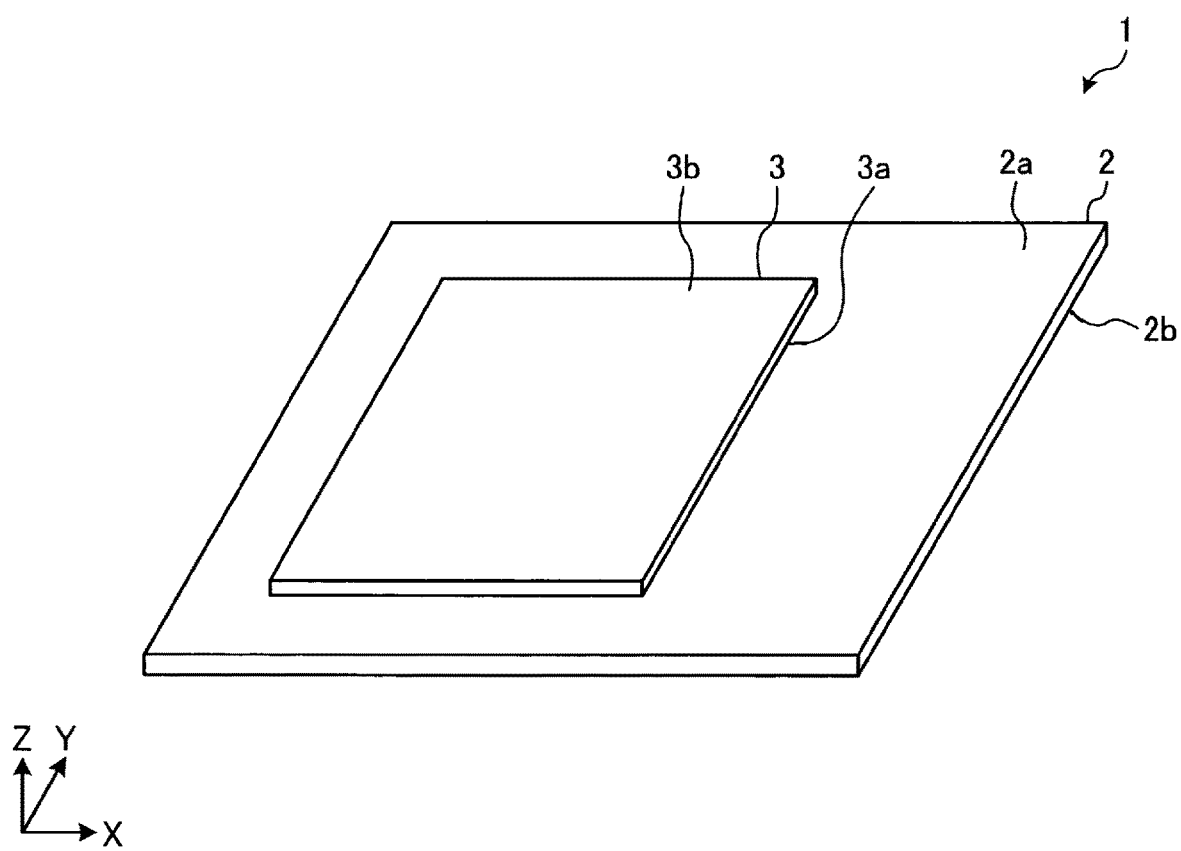
FIG. 1 illustrates the appearance of a power amplifier module according to a first embodiment.

FIG. 1 illustrates an appearance of a power amplifier module of a first embodiment. A power amplifier module 1 includes a first substrate 2 and a second substrate 3.

The power amplifier module 1 can be used to transmit and receive various signals such as voice and data to and from a base station in a mobile communication device exemplified by a cellular phone device.

The first substrate 2 is a non-semiconductor substrate. Examples of the first substrate 2 include rigid substrates composed of glass-epoxy resins and low-temperature co-fired ceramics (LTCCs); and flexible substrates composed of liquid-crystal polymers and polyimide resins. The second substrate 3 is a semiconductor substrate. Examples of the second substrate 3 include integrated circuit (IC) chips (dies).

The first main surface 2a and the second main surface 2b of the first substrate 2 are parallel to the X-Y plane. The first main surface 3a and the second main surface 3b of the second substrate 3 are also parallel to the X-Y plane. The second substrate 3 is superimposed on the first substrate 2 when viewed in the Z direction. The first substrate 2 has an area equal to or larger than the area of a region where the second substrate 3 is superimposed. The first main surface 3a of the second substrate 3 faces the first main surface 2a of the first substrate 2.

In FIG. 1, the entirety of the second substrate 3 is superimposed on the first substrate 2. However, the present disclosure is not limited thereto. It is sufficient that at least part of the second substrate 3 overlaps the first substrate 2.

The first substrate 2 is a multilayer substrate including multiple wiring layers. The first substrate 2 includes a first wiring layer to an N-th wiring layer, where N is a natural number of two or more, from the first main surface 2a toward the second main surface 2b. Examples of the material of each of the wiring layers include aluminum (Al), aluminum-containing alloys, gold (Au), gold-containing alloys, copper (Cu), and copper-containing alloys. An insulator is disposed between adjacent wiring layers.

The first wiring layer is disposed on the first main surface 2a. The N-th wiring layer is disposed on the second main surface 2b. A substantially planar electrode having a substantially plate shape and serving as the N-th wiring layer is disposed on the entire second main surface 2b. The substantially planar electrode is electrically connected to a reference potential. While an example of the reference potential is a ground potential, the present disclosure is not limited thereto.

Figure 2:
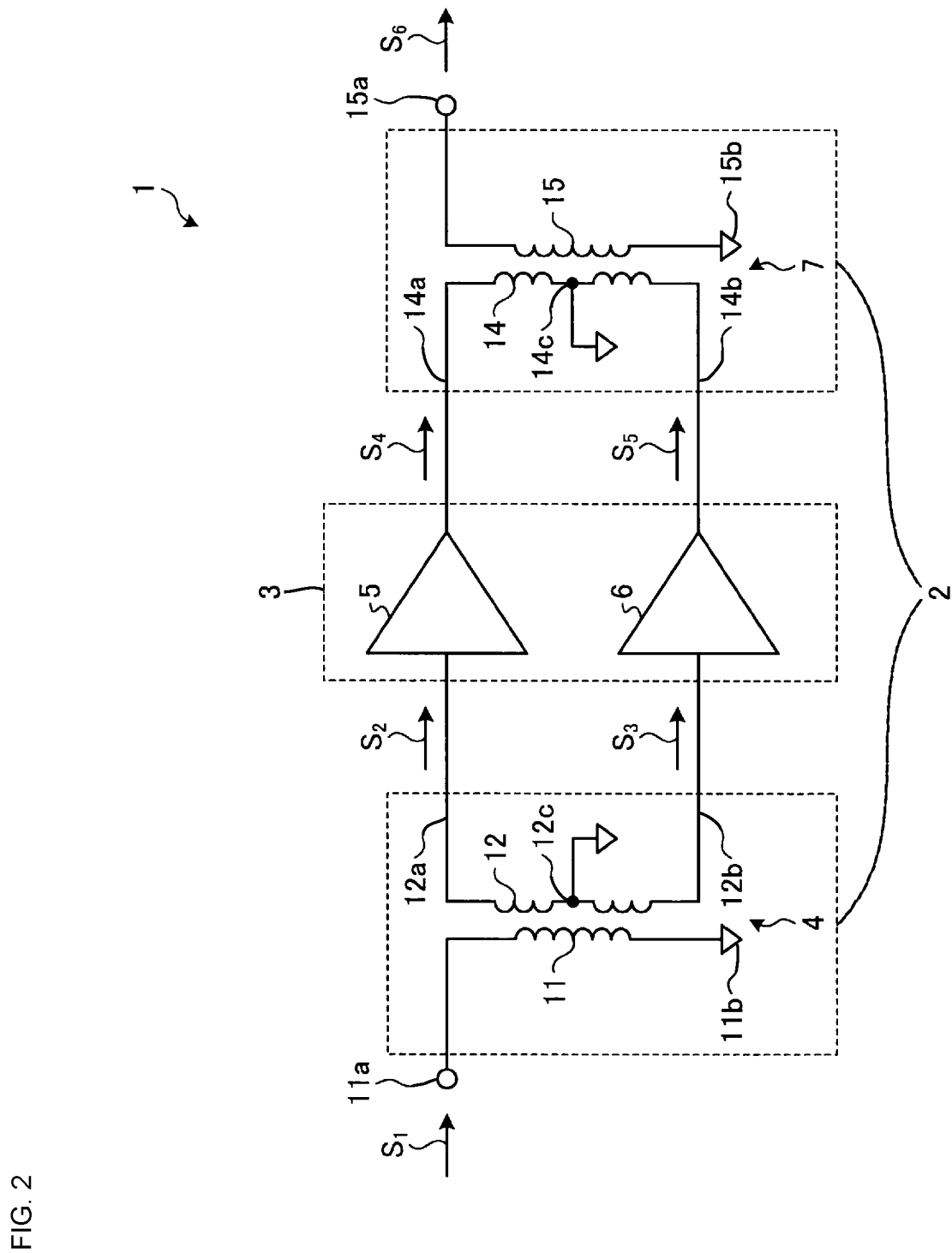
FIG. 2 is a circuit diagram of the power amplifier module according to the first embodiment.

FIG. 2 is a circuit diagram of the power amplifier module according to the first embodiment. The power amplifier module 1 includes a first transformer 4, a first amplifier circuit 5, a second amplifier circuit 6, and a second transformer 7.

The first transformer 4 and the second transformer 7 are disposed in or on the first substrate 2. The first amplifier circuit 5 and the second amplifier circuit 6 are disposed in or on the second substrate 3.

A single-ended signal $S_1$ is inputted to the first end 11a of the primary winding 11 of the first transformer 4. A second end 11b of the primary winding 11 of the first transformer 4 is electrically coupled to a first reference potential.

While an example of the frequency of the signal $S_1$ is about several hundreds of megahertz (MHz) to about several tens of gigahertz, the present disclosure is not limited thereto. For example, in the 900-MHz band specified by the global system for mobile communications (GSM, registered trademark), a frequency range of about 870 MHz to about 960 MHz is exemplified. Additionally, in the 1.9-GHz band specified by GSM (registered trademark), a frequency range of about 1,850 MHz to about 1,990 MHz is exemplified.

The first end 12a of a secondary winding 12 of the first transformer 4 is electrically coupled to the input terminal of the first amplifier circuit 5. The second end 12b of the secondary winding 12 of the first transformer 4 is electrically coupled to the input terminal of the second amplifier circuit 6. The center tap 12c of the secondary winding 12 of the first transformer 4 is electrically coupled to the reference potential.

The first transformer 4 converts the single-ended signal $S_1$ into a pair of differential signals $S_2$ and $S_3$ and outputs the differential signals to the first amplifier circuit 5 and the second amplifier circuit 6.

The first amplifier circuit 5 amplifies the power of the signal $S_2$ and outputs a signal $S_4$. The second amplifier circuit 6 amplifies the power of the signal $S_3$ and outputs a signal $S_5$.

The first end 14a of the primary winding 14 of the second transformer 7 is electrically coupled to the output terminal of the first amplifier circuit 5. The second end 14b of the primary winding 14 of the second transformer 7 is electrically coupled to the output terminal of the second amplifier circuit 6. The center tap 14c of the primary winding 14 of the second transformer 7 is electrically coupled to the reference potential.

A single-ended signal $S_6$ is outputted from the first end 15a of the secondary winding 15 of the second transformer 7. The second end 15b of the secondary winding 15 of the second transformer 7 is electrically coupled to a second reference potential.

The second transformer 7 converts the pair of differential signals $S_4$ and $S_5$ into a single-ended signal $S_6$ and outputs the signal.

The power amplifier module 1 may be used for a multi-stage amplifier circuit. Specifically, another amplifier circuit may be disposed in a stage preceding the first transformer 4, and the amplifier circuit may output the signal $S_1$ to the first end 11a of the primary winding 11 of the first transformer 4. Alternatively, another amplifier circuit may be disposed in a stage following the second transformer 7, and the amplifier circuit may amplify the signal $S_6$.

Figure 3:
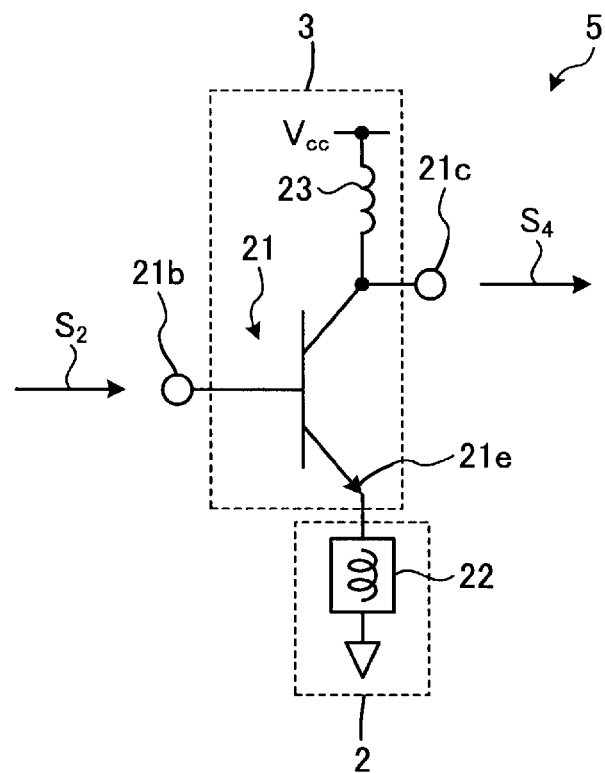
FIG. 3 is a circuit diagram of an amplifier circuit of the power amplifier module of the first embodiment.

FIG. 3 is a circuit diagram of the amplifier circuit of the power amplifier module according to the first embodiment. The first amplifier circuit 5 includes a transistor 21. The transistor 21 is disposed in or on the second substrate 3.

A non-limiting example of the transistor 21 is a heterojunction bipolar transistor (HBT). The transistor 21 may be, for example, a field-effect transistor (FET).

The transistor 21 may be a multi-finger transistor in which multiple unit transistors (also referred to as "fingers") are electrically connected in parallel. The term "unit transistor" refers to a minimum structure functioning as a transistor.

The signal $S_2$ is inputted to the base 21b of the transistor 21. The base 21b serves as an input terminal of the transistor 21.

The emitter 21e of the transistor 21 is coupled to the reference potential through a bump (not illustrated) and a via plug 22. The circuit configuration of the transistor 21 is an emitter-grounded circuit. The via plug 22 is disposed in the first substrate 2. The emitter 21e serves as a common terminal of the transistor 21.

The via plug 22 is composed of a conductor. Examples thereof include aluminum, aluminum-containing alloys, gold, gold-containing alloys, copper, copper-containing alloys, tungsten (W), tungsten-containing alloys, titanium (Ti), and titanium-containing alloys.

The collector 21c of the transistor 21 is coupled to a power supply potential $V_{cc}$ with a choke inductor 23 provided therebetween. A collector current flows from the power supply potential $V_{cc}$ to the collector 21c of the transistor 21 through the choke inductor 23. The choke inductor 23 has the function of blocking the passage of alternating current.

The choke inductor 23 has a sufficiently high impedance with respect to the frequency band of the signal $S_2$. That is, the impedance of the choke inductor 23 can be negligible when considering the frequency band of the signal $S_2$. The choke inductor 23 suppresses the coupling of the signal $S_2$ to a power supply circuit.

The transistor 21 outputs the amplified signal $S_4$ from the collector 21c. The collector 21c serves as an output terminal of the transistor 21.

The circuit configuration of the second amplifier circuit 6 is the same as that of the first amplifier circuit 5; thus, the illustration and description thereof are omitted.

Figure 4:
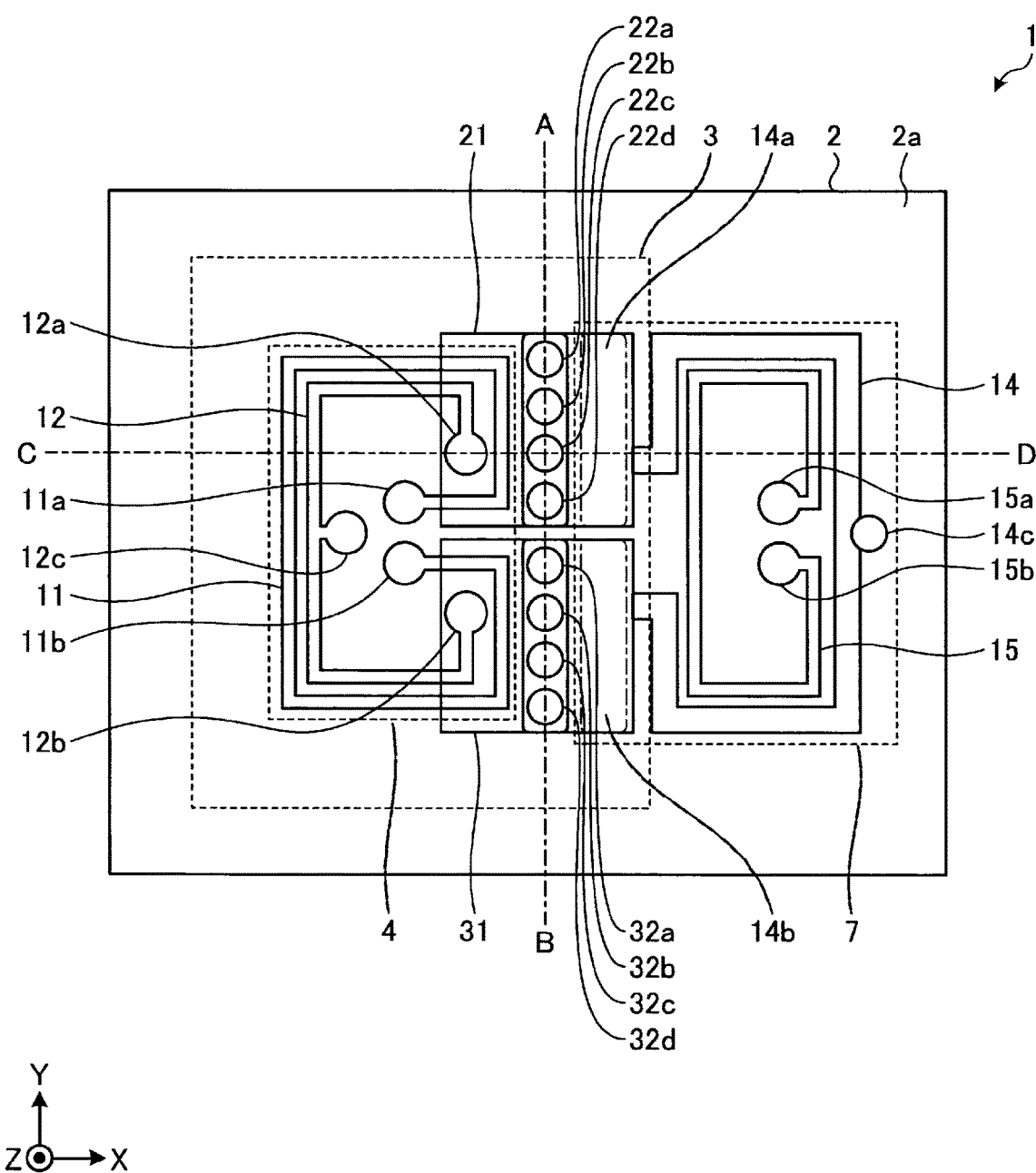
FIG. 4 is a perspective view of the power amplifier module according to the first embodiment when viewed in a direction (Z-axis) perpendicular to a main surface thereof.

FIG. 4 is a perspective view of the power amplifier module according to the first embodiment when viewed in a direction perpendicular to a main surface thereof. In other words, FIG. 4 is a perspective view of the power amplifier module 1 when viewed in the Z direction.

The first transformer 4 and the second transformer 7 are disposed in or on the first substrate 2. The second transformer 7 is disposed adjacent to the first transformer 4 in the X direction. Multiple via plugs 22a, 22b, 22c, 22d, 32a, 32b, 32c, and 32d are disposed between the first transformer 4 and the second transformer 7. The multiple via plugs 22a, 22b, 22c, 22d, 32a, 32b, 32c, and 32d are disposed in a row in the Y direction.

Each of the multiple via plugs 22a, 22b, 22c, 22d, 32a, 32b, 32c, and 32d is a through plug extending from the first wiring layer on the first main surface 2a of the first substrate 2 to the N-th wiring layer on the second main surface 2b. Each of the multiple via plugs 22a, 22b, 22c, 22d, 32a, 32b, 32c, and 32d is electrically coupled to the reference potential through the substantially planar electrode disposed on the second main surface 2b of the first substrate 2.

Each of the multiple via plugs 22a, 22b, 22c, 22d, 32a, 32b, 32c, and 32d is composed of a conductor. Examples thereof include aluminum, aluminum-containing alloys, gold, gold-containing alloys, copper, copper-containing alloys, tungsten, tungsten-containing alloys, titanium, and titanium-containing alloys.

The multiple via plugs 22a, 22b, 22c, 22d, 32a, 32b, 32c, and 32d correspond to one or multiple first conductors according to the present disclosure.

The primary winding 11 and the secondary winding 12 of the first transformer 4 are disposed at any of the first wiring layer to the (N−1)-th wiring layer.

In the power amplifier module 1, the primary winding 11 and the secondary winding 12 are disposed at the same wiring layer. However, the present disclosure is not limited thereto. The primary winding 11 and the secondary winding 12 may be disposed at different wiring layers. In this case, the primary winding 11 and the secondary winding 12 may overlap each other when viewed in the Z direction. One or both of the primary winding 11 and the secondary winding 12 can have a laminated structure including multiple layers.

The first end 11a and the second end 11b of the primary winding 11 of the first transformer 4 are aligned in the Y direction in a substantially central portion of the first transformer 4. The first end 11a is disposed in the positive Y direction of the second end 11b. The primary winding 11 extends from the first end 11a in the X direction, extends counterclockwise along the outer periphery of the first transformer 4, and extends in the direction opposite to the X direction to the second end 11b. The second end 11b is electrically coupled to the substantially planar electrode on the second main surface 2b through the via plug. Thereby, the second end 11b is electrically coupled to the first reference potential.

The first end 12a and the second end 12b of the secondary winding 12 of the first transformer 4 are disposed along a side of the first transformer 4 in the X direction (the right side in FIG. 4). The first end 12a is disposed adjacent to the second end 12b in the positive Y direction. The secondary winding 12 extends counterclockwise from the first end 12a to the second end 12b along the inside of the primary winding 11.

The center tap 12c of the secondary winding 12 of the first transformer 4 is disposed adjacent to a side of the first transformer 4 (the left side in FIG. 4) opposite to a side of the first transformer 4 in the X direction. The center tap 12c is electrically coupled to the substantially planar electrode on the second main surface 2b through the via plug. Thereby, the center tap 12c is electrically coupled to the reference potential.

The primary winding 14 and the secondary winding 15 of the second transformer 7 are disposed at any of the first wiring layer to the (N−1)-th wiring layer.

In the power amplifier module 1, the primary winding 14 and the secondary winding 15 are disposed at the same wiring layer. However, the present disclosure is not limited thereto. The primary winding 14 and the secondary winding 15 may be disposed at different wiring layers. In this case, the primary winding 14 and the secondary winding 15 may overlap each other when viewed in the Z direction. One or both of the primary winding 14 and the secondary winding 15 can have a laminated structure including multiple layers.

The first end 14a and the second end 14b of the primary winding 14 of the second transformer 7 are disposed along a side of the second transformer 7 (the left side in FIG. 4) opposite to a side of the second transformer 7 in the X direction. The first end 14a is disposed adjacent to the second end 14b in the Y direction. The primary winding 14 extends from the first end 14a in the X direction, extends clockwise along the outer periphery of the second transformer 7, and extends in the direction opposite to the X direction to the second end 14b.

The center tap 14c of the primary winding 14 of the second transformer 7 is disposed adjacent to a side of the second transformer 7 in the X direction (the right side in FIG. 4). The center tap 14c is electrically coupled to the substantially planar electrode on the second main surface 2b through the via plug. Thereby, the center tap 14c is electrically coupled to the reference potential.

The first end 15a and the second end 15b of the secondary winding 15 of the second transformer 7 are disposed in the Y direction in a substantially central portion of the second transformer 7. The first end 15a is disposed adjacent to the second end 15b in the Y direction. The secondary winding 15 extends from the first end 15a in the X direction, extends counterclockwise along the inside of the primary winding 14, and extends in the direction opposite to the X direction to the second end 15b.

The second substrate 3 overlaps the first transformer 4, the multiple via plugs 22a, 22b, 22c, 22d, 32a, 32b, 32c, and 32d, and the first end 14a and the second end 14b of the primary winding 14 of the second transformer 7 when viewed in the Z direction.

The transistor 21 of the first amplifier circuit 5 overlaps the first end 12a of the secondary winding 12 of the first transformer 4, the multiple via plugs 22a, 22b, 22c, and 22d, and the first end 14a of the primary winding 14 of the second transformer 7 when viewed in the Z direction.

The base of the transistor 21 is electrically coupled to the first end 12a of the secondary winding 12 of the first transformer 4 through a bump described below.

The emitter of the transistor 21 is electrically coupled to the multiple via plugs 22a, 22b, 22c, and 22d through a bump described below.

While the emitter of the transistor 21 is electrically coupled to the multiple via plugs 22a, 22b, 22c, and 22d, the present disclosure is not limited thereto. It is sufficient that the emitter of the transistor 21 is electrically coupled to at least one of the multiple via plugs 22a, 22b, 22c, and 22d.

The collector of the transistor 21 is electrically coupled to the first end 14a of the primary winding 14 of the second transformer 7 through a bump described below.

The transistor 31 of the second amplifier circuit 6 overlaps the second end 12b of the secondary winding 12 of the first transformer 4, the multiple via plugs 32a, 32b, 32c, and 32d, and the second end 14b of the primary winding 14 of the second transformer 7.

The base of the transistor 31 is electrically coupled to the second end 12b of the secondary winding 12 of the first transformer 4 through a bump described below.

The emitter of the transistor 31 is electrically coupled to the multiple via plugs 32a, 32b, 32c, and 32d through a bump described below.

The collector of the transistor 31 is electrically coupled to the second end 14b of the primary winding 14 of the second transformer 7 through a bump.

Figure 5:
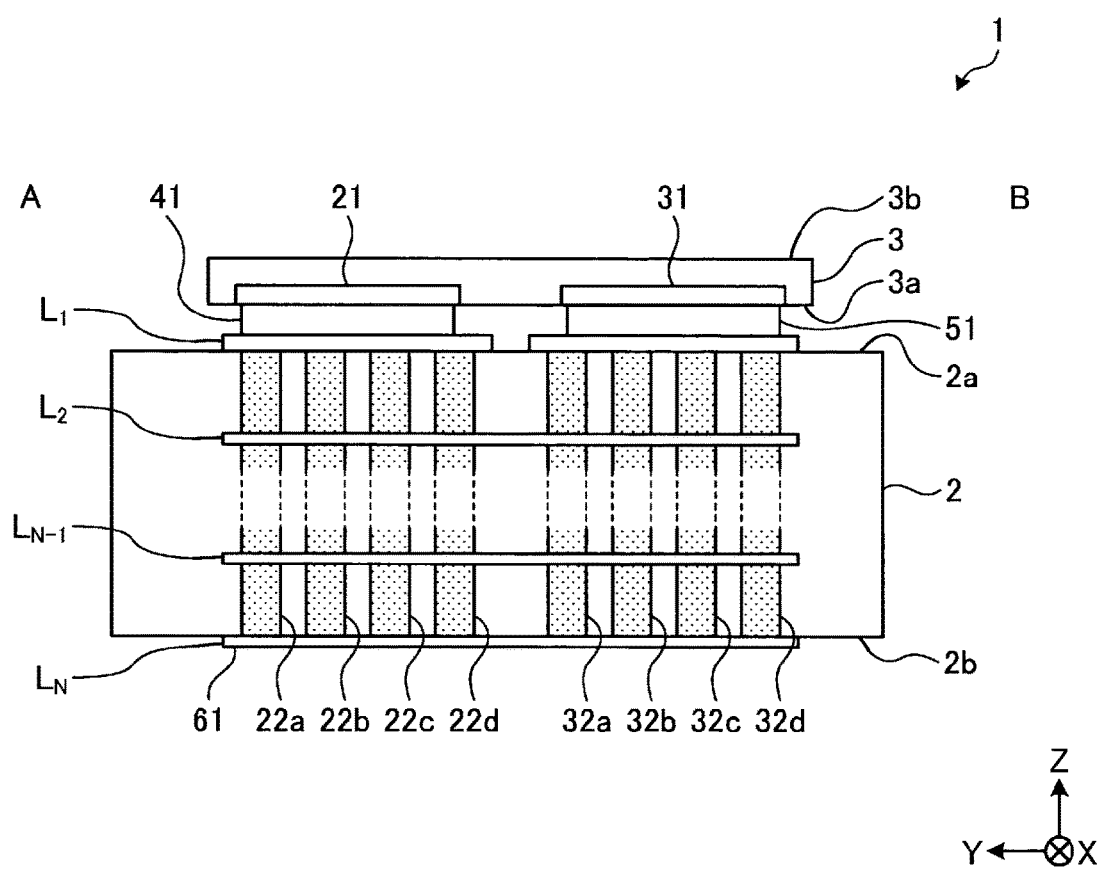
FIG. 5 is a cross-sectional perspective view of the power amplifier module according to the first embodiment, the view being taken along line V-V of FIG. 4.

FIG. 5 is a cross-sectional view of the power amplifier module according to the first embodiment. Specifically, FIG. 5 is a cross-sectional view of the power amplifier module 1, the view being taken along line V-V of FIG. 4.

The first substrate 2 includes the first wiring layer $L_1$, the second wiring layer $L_2$, ..., the (N−1)-th wiring layer $L_{N-1}$, and the N-th wiring layer $L_N$. The substantially planar electrode 61 serving as the N-th wiring layer is disposed on the entire second main surface 2b of the first substrate 2. The substantially planar electrode 61 is electrically coupled to the reference potential.

Each of the multiple via plugs 22a, 22b, 22c, 22d, 32a, 32b, 32c, and 32d is a through plug extending from the first main surface 2a to the second main surface 2b of the first substrate 2. Each of the multiple via plugs 22a, 22b, 22c, 22d, 32a, 32b, 32c, and 32d is electrically coupled to the reference potential through the substantially planar electrode 61 on the second main surface 2b of the first substrate 2.

The emitter of the transistor 21 is electrically coupled to the multiple via plugs 22a, 22b, 22c, and 22d through a bump 41. Thus, the emitter of the transistor 21 is electrically coupled to the reference potential.

The emitter of the transistor 31 is electrically coupled to the multiple via plugs 32a, 32b, 32c, and 32d through a bump 51. Thus, the emitter of the transistor 31 is electrically coupled to the reference potential.

In the power amplifier module 1, the four via plugs 22a, 22b, 22c, and 22d are disposed in the first substrate 2 and electrically coupled to the emitter of the transistor 21. However, the present disclosure is not limited thereto. The number of the via plugs is not limited to four. The via plugs may be a single component having a substantially wall shape.

Similarly, in the power amplifier module 1, the four via plugs 32a, 32b, 32c, and 32d are disposed in the first substrate 2 and electrically coupled to the emitter of the transistor 31. However, the present disclosure is not limited thereto. The number of the via plugs is not limited to four. The via plugs may be a single component having a substantially wall shape.

For example, a single via plug having a substantially wall shape and extending in the Y direction may be disposed in the first substrate 2 and electrically coupled to the emitter of the transistor 21 and the emitter of the transistor 31.

Figure 6:
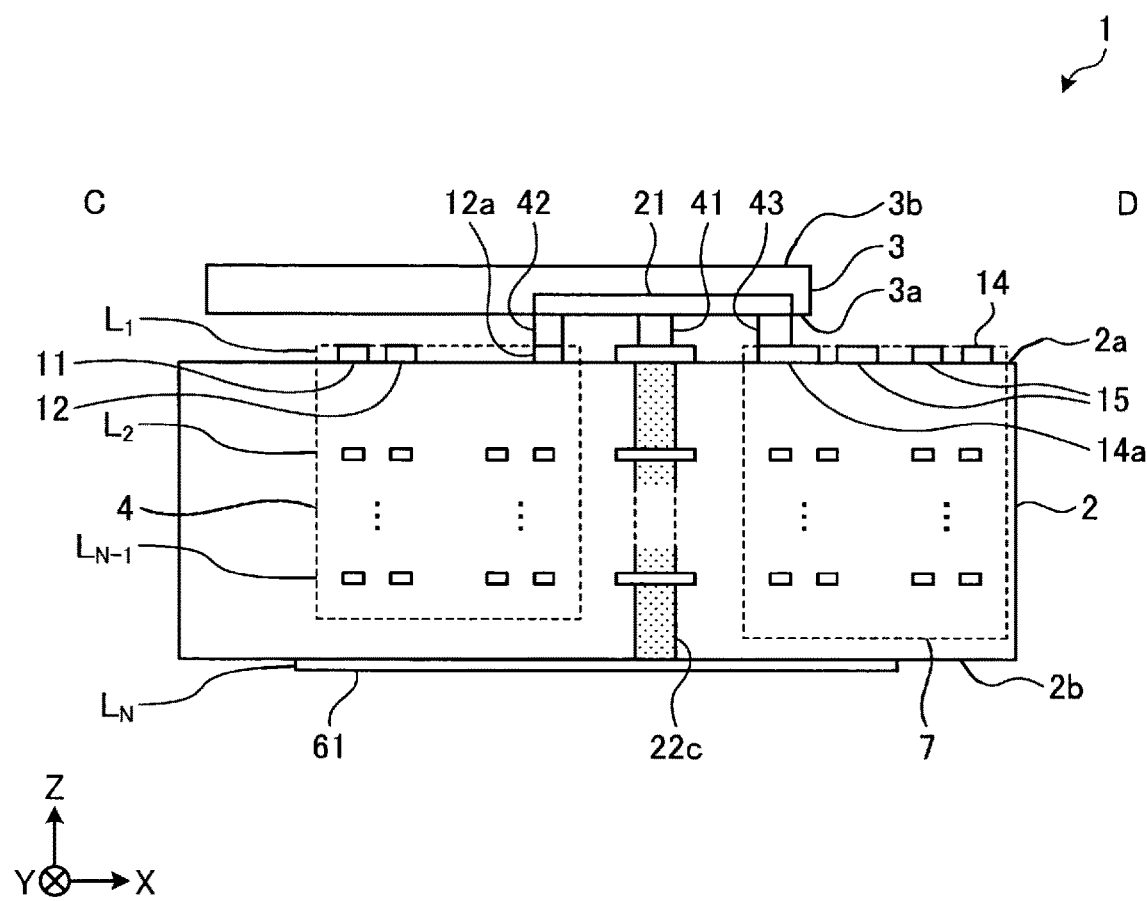
FIG. 6 is a cross-sectional perspective view of the power amplifier module according to the first embodiment, the view being taken along line VI-VI of FIG. 4.

FIG. 6 is a cross-sectional view of the power amplifier module according to the first embodiment. Specifically, FIG. 6 is a cross-sectional view of the power amplifier module 1, the view being taken along line VI-VI of FIG. 4.

The primary winding 11 and the secondary winding 12 of the first transformer 4 are disposed at the first wiring layer $L_1$.

In the power amplifier module 1, the primary winding 11 and the secondary winding 12 of the first transformer 4 are disposed at the first wiring layer $L_1$. However, the present disclosure is not limited thereto. It is sufficient that the primary winding 11 and the secondary winding 12 are disposed at any of the first wiring layer $L_1$ to the (N−1)-th wiring layer $L_{N-1}$. The primary winding 11 and the secondary winding 12 may be disposed at the same wiring layer or different wiring layers. In the case where the primary winding 11 and secondary winding 12 are disposed at different wiring layers, the primary winding 11 and the secondary winding 12 may overlap each other when viewed in the Z direction.

In consideration of suppressing the influence of magnetic flux generated by the first transformer 4, the primary winding 11 and the secondary winding 12 are preferably disposed at or near the center of the first substrate 2 in the thickness direction. For example, when N is an even number, the primary winding 11 and the secondary winding 12 are preferably disposed at the (N/2)-th wiring layer or the ((N/2)+1)-th wiring layer. When N is an odd number, the primary winding 11 and the secondary winding 12 are preferably disposed at the ((N+1)/2)-th wiring layer.

For example, when N=6, the primary winding 11 and the secondary winding 12 are preferably disposed at the third wiring layer or fourth wiring layer. For example, when N=5, the primary winding 11 and the secondary winding 12 are preferably disposed at the third wiring layer. For example, when N=7, the primary winding 11 and the secondary winding 12 are preferably disposed at the fourth wiring layer.

The primary winding 14 and the secondary winding 15 of the second transformer 7 are disposed at the first wiring layer $L_1$.

In the power amplifier module 1, the primary winding 14 and the secondary winding 15 of the second transformer 7 are disposed at the first wiring layer $L_1$. However, the present disclosure is not limited thereto. It is sufficient that the primary winding 14 and the secondary winding 15 are disposed at any of the first wiring layer $L_1$ to the (N−1)-th wiring layer $L_{N-1}$. The primary winding 14 and the secondary winding 15 may be disposed at the same wiring layer or different wiring layers. In the case where the primary winding 14 and the secondary winding 15 are disposed at different wiring layers, the primary winding 14 and the secondary winding 15 may overlap each other when viewed in the Z direction.

In consideration of suppressing the influence of magnetic flux generated by the second transformer 7, the primary winding 14 and the secondary winding 15 are preferably disposed at or near the center of the first substrate 2 in the thickness direction. For example, when N is an even number, the primary winding 14 and the secondary winding 15 are preferably disposed at the (N/2)-th wiring layer or the ((N/2)+1)-th wiring layer. When N is an odd number, the primary winding 14 and the secondary winding 15 are preferably disposed at the ((N+1)/2)-th wiring layer.

The base of the transistor 21 is electrically coupled to the first end 12a of the secondary winding 12 of the first transformer 4 through a bump 42.

The emitter of the transistor 21 is electrically coupled to the via plug 22c through the bump 41.

The collector of the transistor 21 is electrically coupled to the first end 14a of the primary winding 14 of the second transformer 7 through a bump 43.

As described above, the first transformer 4 is disposed in or on the first substrate 2 including the second transformer 7. Thereby, the second substrate 3 of the power amplifier module 1 can have a small area, compared with the case where the first transformer 4 is disposed in or on the second substrate 3. Thus, the power amplifier module 1 can achieve cost reduction.

The multiple via plugs 22a, 22b, 22c, 22d, 32a, 32b, 32c, and 32d are disposed between the first transformer 4 and the second transformer 7. The multiple via plugs 22a, 22b, 22c, 22d, 32a, 32b, 32c, and 32d can suppress the electromagnetic coupling between the first transformer 4 and the second transformer 7. This can ensure the isolation between the first transformer 4 and the second transformer 7 in the power amplifier module 1. In other words, in the power amplifier module 1, the formation of a feedback path between the first transformer 4 and the second transformer 7 can be suppressed. Thus, a decrease in the stability (K-factor) of the power amplifier module 1 can be suppressed.

In consideration of suppressing the electromagnetic coupling between the first transformer 4 and the second transformer 7, the multiple via plugs 22a, 22b, 22c, 22d, 32a, 32b, 32c, and 32d are preferably as follows: The length in the Y direction between an end portion of the via plug 22a in the Y direction and an end portion of the via plug 32d in the direction opposite to the Y direction is preferably equal to or longer than the length of the first transformer 4 or the second transformer 7 in the Y direction. Alternatively, in the case where the electromagnetic coupling between the first transformer 4 and the second transformer 7 can be sufficiently suppressed, the length in the Y direction between the end portion of the via plug 22a in the Y direction and the end portion of the via plug 32d in the direction opposite to the Y direction may be shorter than the length of the first transformer 4 or the second transformer 7 in the Y direction.

The first reference potential coupled to the second end 11b of the primary winding 11 of the first transformer 4 and the second reference potential coupled to the second end 15b of the secondary winding 15 of the second transformer 7 may be isolated from each other or may be a common reference potential. When they are isolated, it is possible to suppress the noise coming from the reference potential and the return of a high-frequency signal. When they are a common reference potential, they can be treated as an ideal reference potential.

Second Embodiment

In the second embodiment, the illustration and the description of the same configuration as the first embodiment are appropriately omitted.

Figure 7:
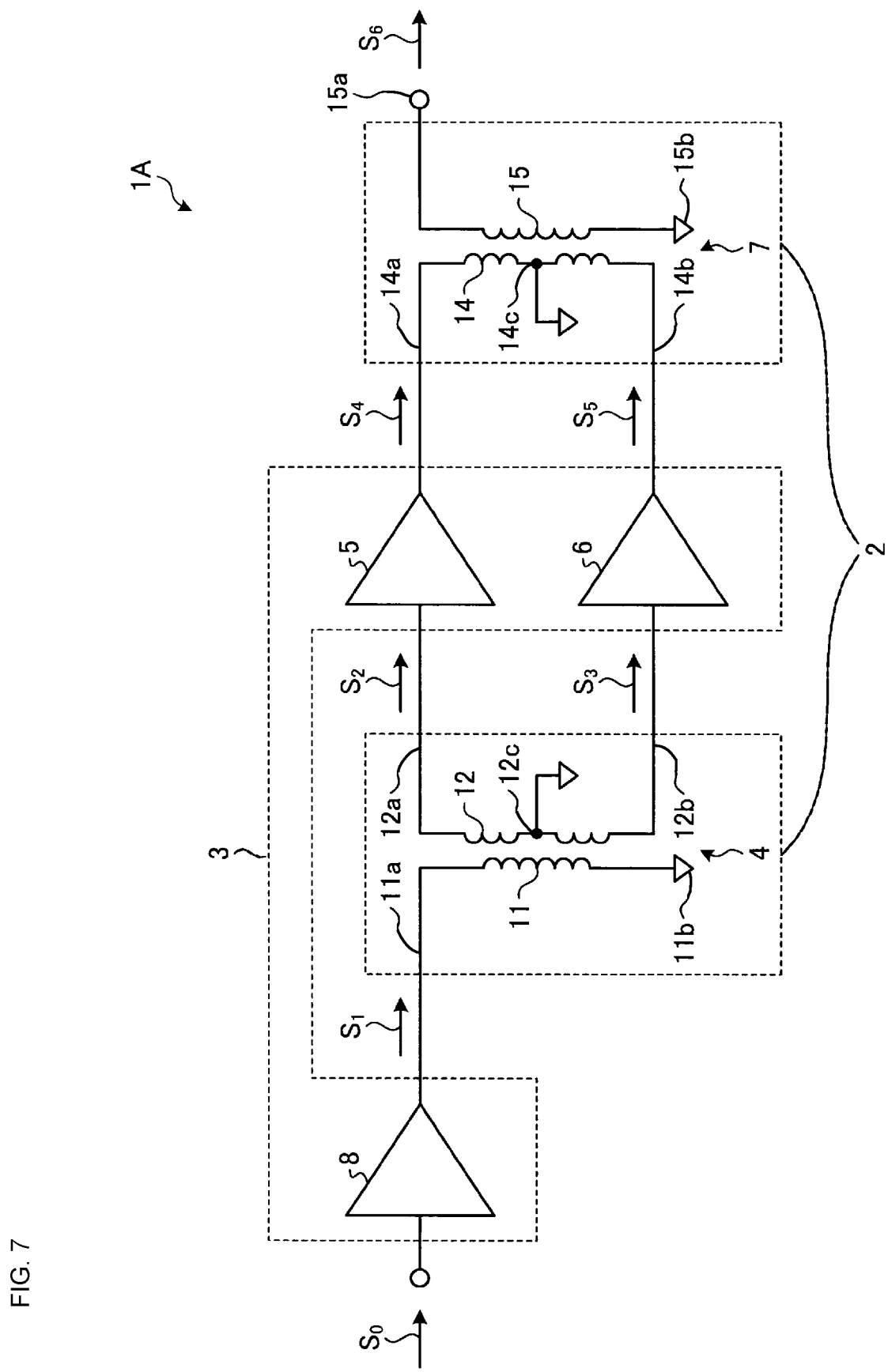
FIG. 7 is a circuit diagram of the power amplifier module according to a second embodiment.

FIG. 7 is a circuit diagram of a power amplifier module according to a second embodiment. A power amplifier module LA includes a third amplifier circuit 8 in addition to the first transformer 4, the first amplifier circuit 5, the second amplifier circuit 6, and the second transformer 7.

The third amplifier circuit 8 is disposed in or on the second substrate 3.

A single-ended signal $S_0$ is inputted to the input terminal of the third amplifier circuit 8. The third amplifier circuit 8 amplifies the signal $S_0$ and outputs the amplified signal $S_1$ to the first end 11a of the primary winding 11 of the first transformer 4.

The circuit configuration of the third amplifier circuit 8 is the same as the circuit configuration of the first amplifier circuit 5 (see FIG. 3); thus, the illustration and the description thereof are omitted.

The third amplifier circuit 8 may be referred to as a "driver stage amplifier circuit". Each of the first amplifier circuit 5 and the second amplifier circuit 6 may be referred to as an "output stage amplifier circuit".

Figure 8:
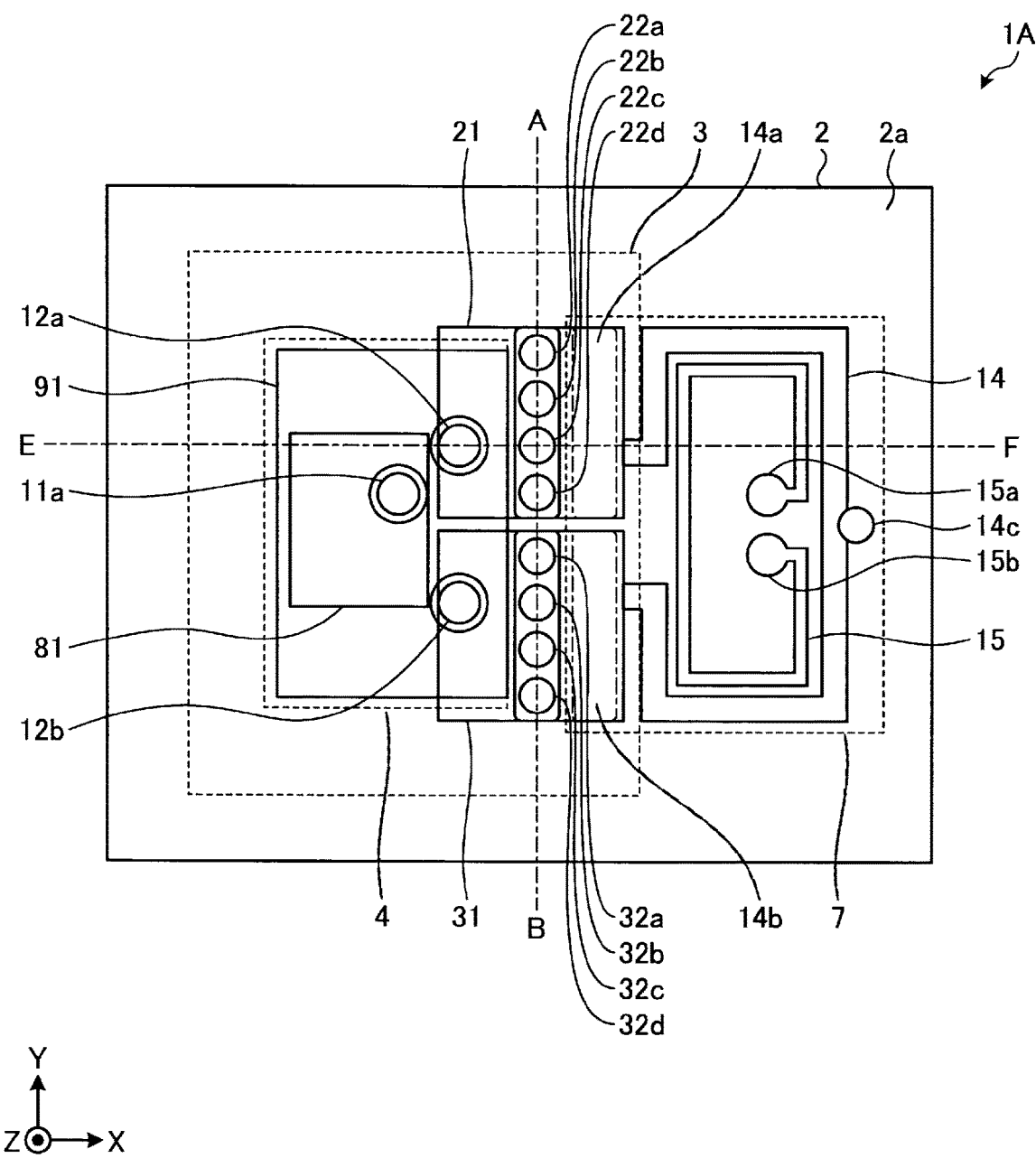
FIG. 8 is a perspective view of the power amplifier module according to the second embodiment when viewed in a direction (Z-axis) perpendicular to a main surface thereof.

FIG. 8 illustrates the power amplifier module according to the second embodiment when viewed in a direction perpendicular to a main surface thereof. That is, FIG. 8 illustrates the power amplifier module 1A when viewed in the Z direction.

The collector (output terminal) of a transistor 81 in the third amplifier circuit 8 is electrically coupled to the first end 11a of the primary winding 11 of the first transformer 4 through a bump.

The primary winding 11 and the secondary winding 12 of the first transformer 4 are disposed at any of the second wiring layer to the (N−1)-th wiring layer.

A shielding material 91 is disposed at the first wiring layer on the first main surface 2a of the first substrate 2 and is disposed in a region superimposed on the first transformer 4 when viewed in the Z direction. The shielding material 91 is a conductor. Examples thereof include aluminum, aluminum-containing alloys, gold, gold-containing alloys, copper, and copper-containing alloys. The shielding material 91 prevents lines of magnetic flux from the first transformer 4 toward the second substrate 3.

In the power amplifier module 1A, the entirety of the shielding material 91 overlaps the first transformer 4. However, the present disclosure is not limited thereto. It is sufficient that at least part of the shielding material 91 is superimposed on the first transformer 4.

The shielding material 91 corresponds to a second conductor according to the present disclosure.

The transistor 81 in the third amplifier circuit 8 is disposed in a region superimposed on the first transformer 4 when viewed in the Z direction.

In the power amplifier module 1A, the entirety of the transistor 81 in the third amplifier circuit 8 is superimposed on the first transformer 4. However, the present disclosure is not limited thereto. It is sufficient that at least part of the transistor 81 in the third amplifier circuit 8 overlaps the first transformer 4.

The transistor 81 in the third amplifier circuit 8 is disposed in a region superimposed on the shielding material 91 when viewed in the Z direction.

Figure 9:
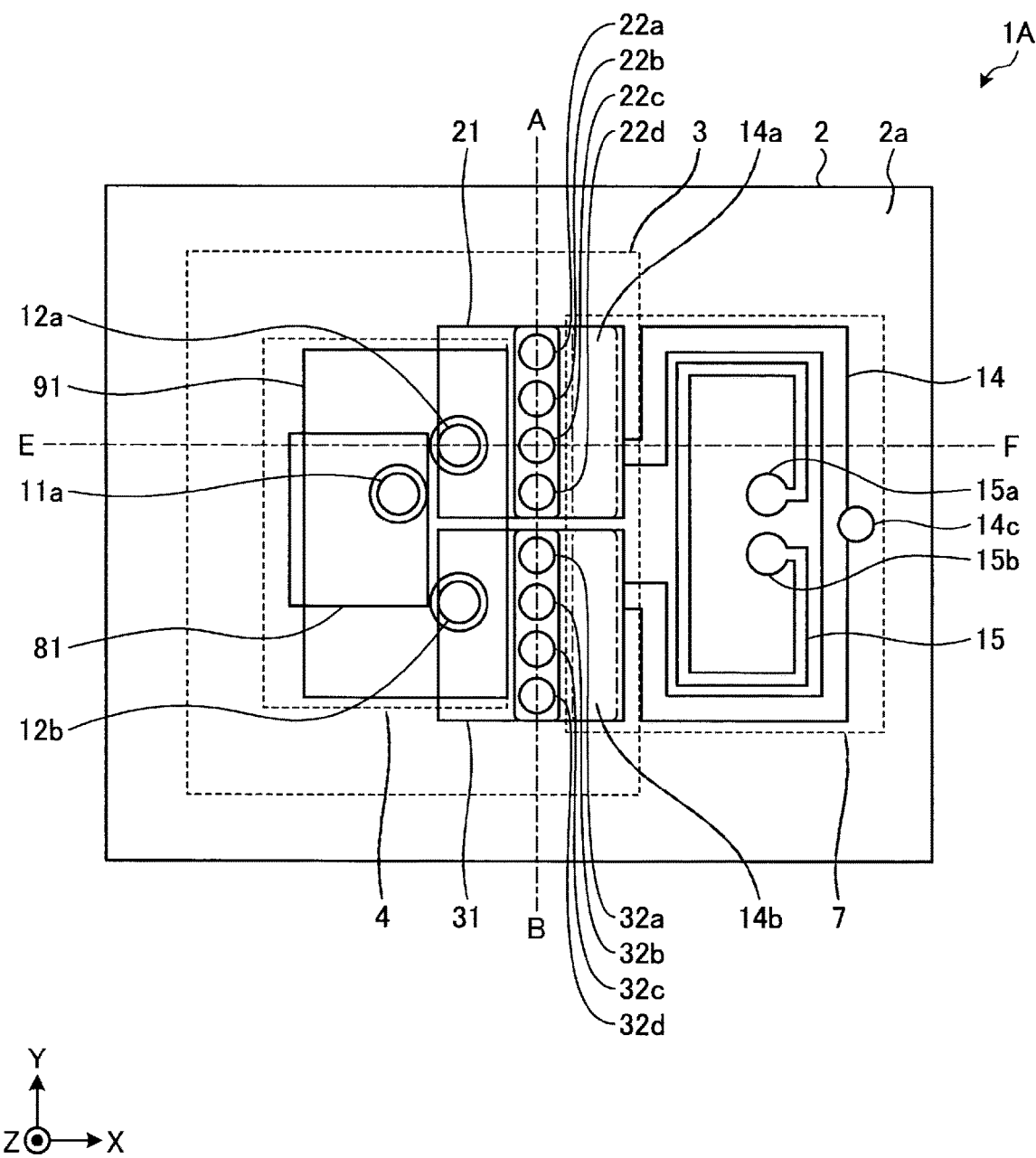
FIG. 9 is a perspective view of a power amplifier module according to a modification of the second embodiment when viewed in a direction (Z-axis) perpendicular to a main surface thereof.

In the power amplifier module 1A, the entirety of the transistor 81 in the third amplifier circuit 8 is superimposed on the shielding material 91. However, the present disclosure is not limited thereto. It is sufficient that at least part of the transistor 81 in the third amplifier circuit 8 is superimposed on the shielding material 91. For example, as illustrated in FIG. 9, the left side of the shielding material 91 may lie to the right of the left side of the transistor 81 (in the X direction).

The cross-sectional view, taken along line A-B of FIG. 8, of the power amplifier module 1A is the same as in FIG. 5; thus, the illustration and the description thereof are omitted.

Figure 10:
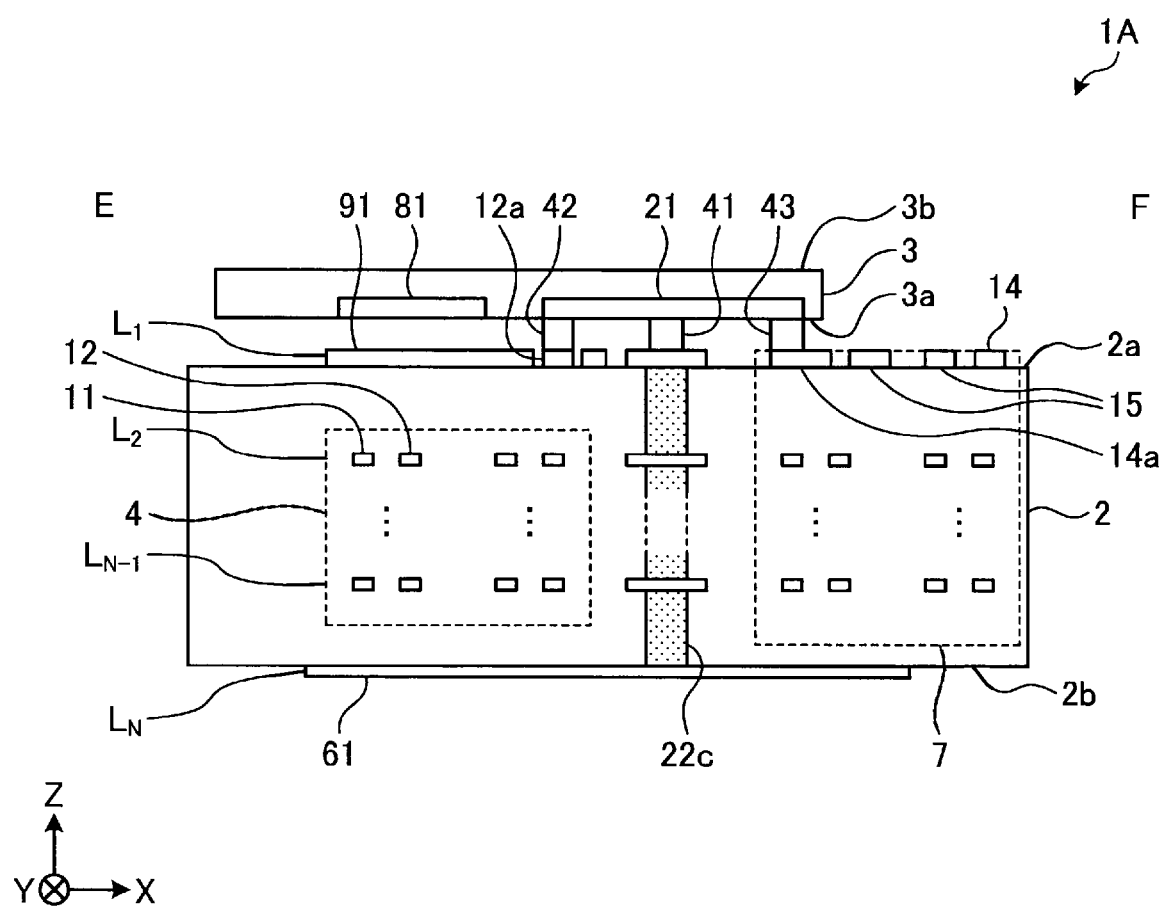
FIG. 10 is a cross-sectional perspective view of the power amplifier module according to the second embodiment, the view being taken along line X-X of FIG. 8.

FIG. 10 is a cross-sectional view of the power amplifier module according to the second embodiment. Specifically, FIG. 10 is a cross-sectional view of the power amplifier module 1A, the view being taken along line X-X of FIG. 8.

The primary winding 11 and the secondary winding 12 of the first transformer 4 are disposed at the second wiring layer $L_2$.

In the power amplifier module 1A, the primary winding 11 and the secondary winding 12 of the first transformer 4 are disposed at the second wiring layer $L_2$. However, the present disclosure is not limited thereto. It is sufficient that the primary winding 11 and the secondary winding 12 are disposed at any of the second wiring layer $L_2$ to the (N−1)-th wiring layer $L_{N-1}$. The primary winding 11 and the secondary winding 12 may be disposed at the same wiring layer or different wiring layers. In the case where the primary winding 11 and the secondary winding 12 are disposed at different wiring layers, the primary winding 11 and the secondary winding 12 may overlap each other when viewed in the Z direction.

The primary winding 11 and the secondary winding 12 may be disposed at any of the third wiring layer to the (N−1)-th wiring layer $L_{N-1}$. In this case, the shielding material 91 may be disposed at the second wiring layer $L_2$. That is, it is sufficient that the shielding material 91 is disposed at a wiring layer closer to the second substrate 3 than the primary winding 11 and the secondary winding 12.

As described as above, the shielding material 91 overlaps the first transformer 4 and the transistor 81 in the third amplifier circuit 8 when viewed in the Z direction. Thereby, the shielding material 91 prevents lines of magnetic flux from the first transformer 4 toward the transistor 81 in the third amplifier circuit 8. Thus, the shielding material 91 can suppress the electromagnetic coupling between the first transformer 4 and the transistor 81. This can ensure the isolation between the first transformer 4 and the transistor 81 in the power amplifier module 1A. In other words, in the power amplifier module 1A, the formation of a feedback path between the first transformer 4 and the transistor 81 can be suppressed. Thus, a decrease in the stability (K-factor) of the power amplifier module 1A can be suppressed.

In consideration of suppressing the electromagnetic coupling between the first transformer 4 and the transistor 81 in the third amplifier circuit 8, the shielding material 91 may be as follows: The shielding material 91 may be superimposed on the entirety of the first transformer 4 or the transistor 81. In the case where the electromagnetic coupling between the first transformer 4 and the transistor 81 can be sufficiently suppressed, the shielding material 91 may overlap the first transformer 4 or the transistor 81 in part.

Modification of Second Embodiment

In a modification of the second embodiment, the illustration and the description of the same configuration as the second embodiment are appropriately omitted.

Figure 11:
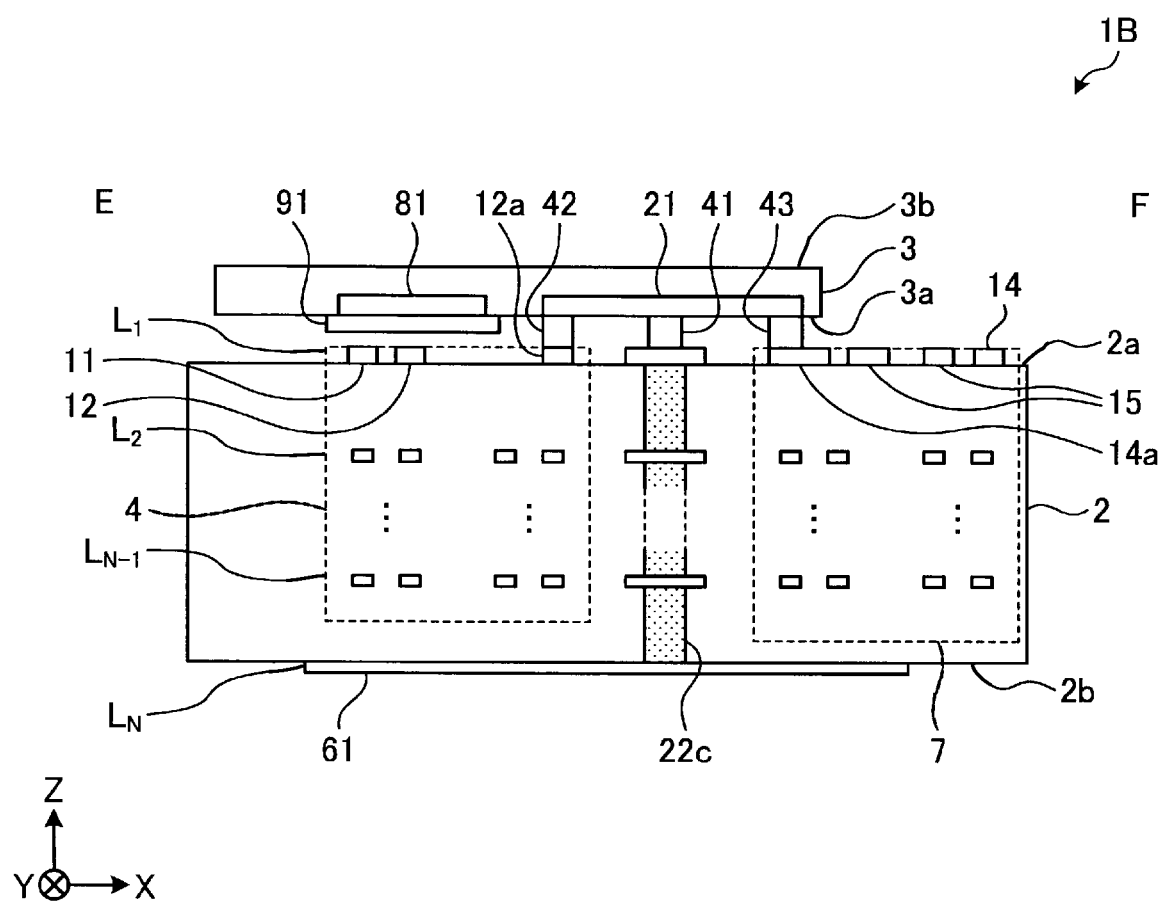
FIG. 11 is a cross-sectional view of the power amplifier module according to the modification of the second embodiment, the view being taken along line XI-XI of FIG. 9.

FIG. 11 is a cross-sectional view of a power amplifier module according to the modification of the second embodiment. Specifically, FIG. 11 is a cross-sectional view of a power amplifier module 1B, the view being taken along line XI-XI of FIG. 8.

The primary winding 11 and the secondary winding 12 of the first transformer 4 are disposed at the first wiring layer $L_1$.

The shielding material 91 is disposed on the first main surface 3a of the second substrate 3 and overlaps a region superimposed on the transistor 81 in the third amplifier circuit 8 when viewed in the Z direction.

The entirety of the transistor 81 in the third amplifier circuit 8 may be superimposed on the shielding material 91. At least part of the transistor 81 in the third amplifier circuit 8 may overlap the shielding material 91.

In the power amplifier module 1B, the primary winding 11 and the secondary winding 12 of the first transformer 4 are disposed at the first wiring layer $L_1$. However, the present disclosure is not limited thereto. It is sufficient that the primary winding 11 and the secondary winding 12 are disposed at any of the first wiring layer $L_1$ to the (N−1)-th wiring layer $L_{N-1}$. The primary winding 11 and the secondary winding 12 may be disposed at the same wiring layer or different wiring layers. In the case where the primary winding 11 and the secondary winding 12 are disposed at different layers, the primary winding 11 and the secondary winding 12 may overlap each other when viewed in the Z direction.

As described above, the shielding material 91 overlaps the first transformer 4 and the transistor 81 in the third amplifier circuit 8 when viewed in the Z direction. Thereby, the shielding material 91 prevents lines of magnetic flux from the first transformer 4 toward the transistor 81 in the third amplifier circuit 8. Thus, the shielding material 91 can suppress the electromagnetic coupling between the first transformer 4 and the transistor 81. This can ensure the isolation between the first transformer 4 and the transistor 81 in the power amplifier module 1B. In other words, in the power amplifier module 1B, the formation of a feedback path between the first transformer 4 and the transistor 81 can be suppressed. Thus, a decrease in the stability (K-factor) of the power amplifier module 1B can be suppressed.

In consideration of suppressing the electromagnetic coupling between the first transformer 4 and the transistor 81 in the third amplifier circuit 8, the shielding material 91 may be as follows: The shielding material 91 may be superimposed on the entirety of the transistor 81. In the case where the electromagnetic coupling between the first transformer 4 and the transistor 81 can be sufficiently suppressed, the shielding material 91 may overlap the transistor 81 in part.

The foregoing embodiments are intended to facilitate understanding of the present disclosure but are not intended to impose limitation on the interpretation of the present disclosure. The present disclosure can be altered or modified without departing from the spirit of the present disclosure, and also includes equivalents of the disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplifier module, comprising:
a first substrate having a first main surface, a second main surface, and a plurality of wiring layers; and
a second substrate having a first main surface that faces the first main surface of the first substrate, at least part of the second substrate overlapping the first substrate in a direction perpendicular to the first main surface of the first substrate,
wherein the second substrate comprises:
a first amplifier circuit; and
a second amplifier circuit, each of the first amplifier circuit and the second amplifier circuit being configured to amplify power, and
wherein the first substrate comprises:
a first transformer disposed at one or more of the plurality of wiring layers, the first transformer comprising:
a primary winding having a first end to which a signal is input, and a second end electrically coupled to a first reference potential, and
a secondary winding having a first end electrically coupled to an input terminal of the first amplifier circuit, and a second end electrically coupled to an input terminal of the second amplifier circuit;
a second transformer that is disposed at a position that does not overlap the first transformer in the direction perpendicular to the first main surface of the first substrate, and that is disposed at one or more of the plurality of wiring layers, the second transformer comprising:
a primary winding having a first end electrically coupled to an output terminal of the first amplifier circuit, and a second end electrically coupled to an output terminal of the second amplifier circuit, and
a secondary winding having a first end from which a signal is output, and a second end electrically coupled to a second reference potential; and
a plurality of first conductors disposed in a row between the first transformer and the second transformer, each of the plurality of first conductors extending from a wiring layer on the first main surface of the first substrate to a wiring layer on the second main surface of the first substrate.

2. A power amplifier module, comprising:
a first substrate having a first main surface, a second main surface, and a plurality of wiring layers; and
a second substrate having a first main surface facing the first main surface of the first substrate, at least part of the second substrate overlapping the first substrate in a direction perpendicular to the first main surface of the first substrate,
wherein the second substrate comprises:
a first amplifier circuit; and
a second amplifier circuit, each of the first amplifier circuit and the second amplifier circuit being configured to amplify power, and
wherein the first substrate comprises:
a first transformer disposed at one or more of the plurality of wiring layers, the first transformer comprising:
a primary winding having a first end to which a signal is input, and a second end electrically coupled to a first reference potential, and
a secondary winding having a first end electrically coupled to an input terminal of the first amplifier circuit, and a second end electrically coupled to an input terminal of the second amplifier circuit;
a second transformer that is disposed at a position that does not overlap the first transformer in the direction perpendicular to the first main surface of the first substrate, and that is disposed at one or more wiring of the plurality of wiring layers, the second transformer comprising:
a primary winding having a first end electrically coupled to an output terminal of the first amplifier circuit, and a second end electrically coupled to an output terminal of the second amplifier circuit, and
a secondary winding having a first end from which a signal is output, and a second end electrically coupled to a second reference potential; and
a first conductor that is a single component having a substantially wall shape, the first conductor being disposed between the first transformer and the second transformer and extending from a wiring layer on the first main surface of the first substrate to a wiring layer on the second main surface of the first substrate.

3. The power amplifier module according to claim 1, further comprising:
a substantially planar electrode disposed on the wiring layer on the second main surface of the first substrate, the substantially planar electrode being electrically coupled to the first conductor and to the first reference potential or the second reference potential.

4. The power amplifier module according to claim 2, further comprising:
a substantially planar electrode disposed on the wiring layer on the second main surface of the first substrate, the substantially planar electrode being electrically coupled to the first conductor and to the first reference potential or the second reference potential.

5. The power amplifier module according to claim 1, wherein each of the first amplifier circuit and the second amplifier circuit comprises a transistor, and
wherein the transistor has a common terminal electrically coupled to the first conductor.

6. The power amplifier module according to claim 2, wherein each of the first amplifier circuit and the second amplifier circuit comprises a transistor, and
wherein the transistor has a common terminal electrically coupled to the first conductor.

7. The power amplifier module according to claim 3, wherein each of the first amplifier circuit and the second amplifier circuit comprises a transistor, and
wherein the transistor has a common terminal electrically coupled to the first conductor.

8. The power amplifier module according to claim 5, wherein:
the first end of the secondary winding of the first transformer is electrically coupled to an input terminal of the transistor of the first amplifier circuit,
the second end of the secondary winding of the first transformer is electrically coupled to an input terminal of the transistor of the second amplifier circuit,
the first end of the primary winding of the second transformer is electrically coupled to an output terminal of the transistor of the first amplifier circuit, and
the second end of the primary winding of the second transformer is electrically coupled to an output terminal of the transistor of the second amplifier circuit.

9. The power amplifier module according to claim 6, wherein:
the first end of the secondary winding of the first transformer is electrically coupled to an input terminal of the transistor of the first amplifier circuit,
the second end of the secondary winding of the first transformer is electrically coupled to an input terminal of the transistor of the second amplifier circuit,
the first end of the primary winding of the second transformer is electrically coupled to an output terminal of the transistor of the first amplifier circuit, and
the second end of the primary winding of the second transformer is electrically coupled to an output terminal of the transistor of the second amplifier circuit.

10. The power amplifier module according to claim 1, wherein the second substrate further comprises a third amplifier circuit having an output terminal electrically coupled to the first end of the first transformer, the third amplifier circuit being configured to output a power amplified signal to the first end of the first transformer.

11. The power amplifier module according to claim 2, wherein the second substrate further comprises a third amplifier circuit having an output terminal electrically coupled to the first end of the first transformer, the third amplifier circuit being configured to output a power amplified signal to the first end of the first transformer.

12. The power amplifier module according to claim 10, wherein the primary winding of the first transformer and the secondary winding of the first transformer are disposed at one of the plurality wiring layers other than the wiring layer on the first main surface of the first substrate.

13. The power amplifier module according to claim 11, wherein the primary winding of the first transformer and the secondary winding of the first transformer are disposed at one of the plurality wiring layers other than the wiring layer on the first main surface of the first substrate.

14. The power amplifier module according to claim 12, wherein the first substrate further comprises a second conductor disposed at a wiring layer closer to the second substrate than the primary winding of the first transformer and than the secondary winding of the first transformer, at least part of the second conductor overlapping the primary winding of the first transformer in the direction perpendicular to the first main surface of the first substrate.

15. The power amplifier module according to claim 13, wherein the first substrate further comprises a second conductor disposed at a wiring layer closer to the second substrate than the primary winding of the first transformer and than the secondary winding of the first transformer, at least part of the second conductor overlapping the primary winding of the first transformer in the direction perpendicular to the first main surface of the first substrate.

16. The power amplifier module according to claim 10, wherein the second substrate further comprises a second conductor disposed on the first main surface of the second substrate, at least part of the second conductor overlapping the primary winding of the first transformer in a direction perpendicular to the first main surface of the second substrate.

17. The power amplifier module according to claim 11, wherein the second substrate further comprises a second conductor disposed on the first main surface of the second substrate, at least part of the second conductor overlapping the primary winding of the first transformer in a direction perpendicular to the first main surface of the second substrate.

18. The power amplifier module according to claim 1, wherein the first reference potential is equal to the second reference potential.

19. The power amplifier module according to claim 2, wherein the first reference potential is equal to the second reference potential.

20. The power amplifier module according to claim 3, wherein the first reference potential is equal to the second reference potential.

* * * * *

UNITED STATES PATENT AND TRADEMARK OFFICE
CERTIFICATE OF CORRECTION

| | | |
|---|---|---|
| PATENT NO. | : 11,196,394 B2 | Page 1 of 1 |
| APPLICATION NO. | : 16/527578 | |
| DATED | : December 7, 2021 | |
| INVENTOR(S) | : Shigeki Koya et al. | |

It is certified that error appears in the above-identified patent and that said Letters Patent is hereby corrected as shown below:

In the Specification

Column 10, Line 50, "LA" should be -- 1A --.

Signed and Sealed this
Twenty-third Day of August, 2022

Katherine Kelly Vidal
*Director of the United States Patent and Trademark Office*